(12) United States Patent
Freese

(10) Patent No.: US 10,008,259 B1
(45) Date of Patent: Jun. 26, 2018

(54) LIMITING BITLINE PRECHARGE DRIVE FIGHT CURRENT USING MULTIPLE POWER DOMAINS

(71) Applicant: Advanced Micro Devices, Inc., Sunnyvale, CA (US)

(72) Inventor: Ryan Thomas Freese, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days. days.

(21) Appl. No.: 15/371,631

(22) Filed: Dec. 7, 2016

(51) Int. Cl.
*G11C 11/419* (2006.01)

(52) U.S. Cl.
CPC .................................. *G11C 11/419* (2013.01)

(58) Field of Classification Search
CPC .................................................... G11C 11/419
USPC ......................................................... 365/154
See application file for complete search history.

(56) References Cited

U.S. PATENT DOCUMENTS

| 5,712,826 | A | 1/1998 | Wong et al. |
| 5,760,627 | A | 6/1998 | Gregor et al. |
| 5,764,089 | A | 6/1998 | Partovi et al. |
| 5,917,355 | A | 6/1999 | Klass |
| 5,933,038 | A | 8/1999 | Klass |
| 5,973,955 | A | 10/1999 | Nogle et al. |
| 6,037,824 | A | 3/2000 | Takahashi |
| 6,067,257 | A * | 5/2000 | Kitsukawa ............ G11C 5/147 365/189.09 |
| 6,094,071 | A | 7/2000 | Ciraula et al. |
| 6,278,308 | B1 | 8/2001 | Partovi et al. |
| 6,437,625 | B1 | 8/2002 | Kojima et al. |
| 6,756,823 | B1 | 6/2004 | Chen et al. |
| 7,057,421 | B2 | 6/2006 | Shi et al. |
| 7,301,373 | B1 | 11/2007 | Bailey et al. |
| 8,325,511 | B2 * | 12/2012 | Seshadri ............... G11C 11/417 365/154 |
| 2005/0226081 | A1 * | 10/2005 | Kajitani ................. G11C 7/08 365/230.03 |
| 2008/0291750 | A1 * | 11/2008 | Takahashi ............. G11C 5/145 365/189.09 |
| 2011/0261609 | A1 * | 10/2011 | Seshadri ............... G11C 11/417 365/154 |

* cited by examiner

*Primary Examiner* — Harry W Byrne
(74) *Attorney, Agent, or Firm* — Rory D. Rankin; Meyertons, Hood, Kivlin, Kowert & Goetzel, P.C.

(57) ABSTRACT

A system and method for efficient power, performance and stability tradeoffs of memory accesses are described. A memory includes an array of cells for storing data and a sense amplifier for controlling access to the array. The cells receive word line inputs for data access driven by a first voltage supply. The sense amplifier includes first precharge logic, which receives a first precharge input driven by the first power supply used by the array. Therefore, the first precharge input has similar timing characteristics as the word line input used in the array. The sense amplifier includes second precharge logic, which receives a second precharge input driven by a second power supply not used by the array and provides precharged values on bit lines driven by the second power supply.

16 Claims, 6 Drawing Sheets

LIMITING BITLINE PRECHARGE DRIVE FIGHT CURRENT USING MULTIPLE POWER DOMAINS

BACKGROUND

Description of the Relevant Art

Generally speaking, a semiconductor chip includes at least one processing unit coupled to a memory. The processing unit processes instructions by fetching instructions and data, decoding instructions, executing instructions, and storing results. The processing unit sends memory access requests to the memory for both fetching instructions and data and storing results of computations. For semiconductor chips with multiple processing units, the demand for memory increases. A larger amount of memory provides both sufficient storage for each processing unit and sharing of more information across the multiple processing units.

In some embodiments, the processing unit and the memory are on a same die. In other embodiments, the processing unit and the memory are on different dies within a same package such as a system-on-a-chip (SOC). Static random access memory (SRAM) is commonly used for the memory. The SRAM includes an array of many bit cells and a logic portion used for accessing values stored in the array. In order to balance performance, power consumption, and bit cell stability of the SRAM, multiple design techniques are used. These design techniques provide many challenges as the tradeoffs become abundant. In addition, the tradeoffs may demand that more devices be used to satisfy the tradeoffs for multiple voltage and timing requirements.

In view of the above, efficient methods and systems for providing efficient power, performance and stability tradeoffs of memory accesses are desired.

Figure 1:
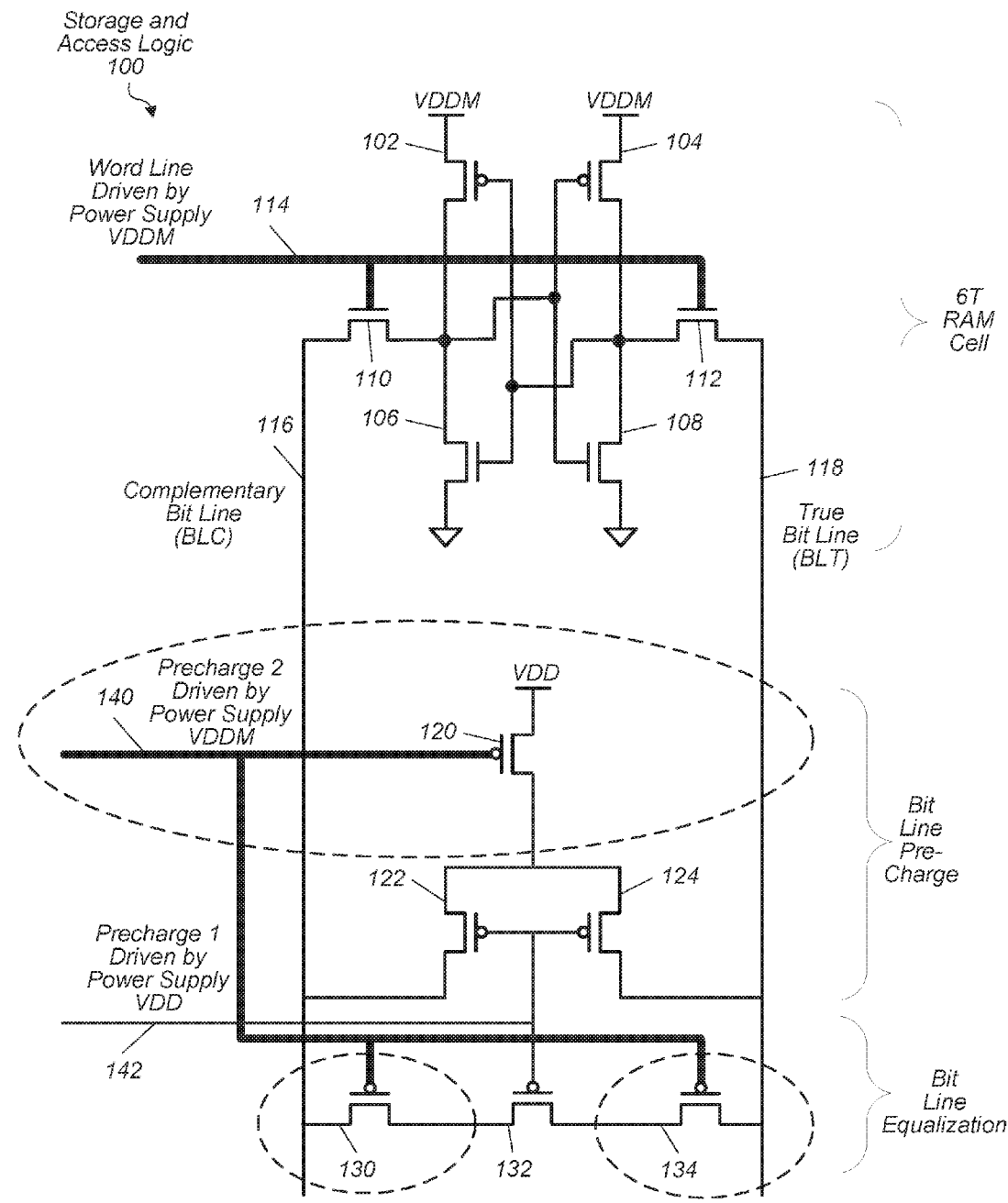
FIG. 1 is a generalized diagram of one embodiment of a macro cell.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for providing efficient power, performance and stability tradeoffs of memory accesses are contemplated. A memory includes an array of macro cells. Each macro cell includes a bit cell used for storing data and a logic portion coupled to the bit cell for controlling access to the bit cell. Each of the bit cell and the logic portion uses different voltage supplies. Each of the bit cells in the marcro cell is supplied with voltage from a first voltage supply, whereas the logic portion is supplied with voltage from both the first power supply and a second power supply different from the first power supply. The bit cells receive word line inputs for a data access driven by the first voltage supply.

In various embodiments, the logic portion is used for precharging bit lines prior to read or write accesses of data stored in the bit cells. In various embodiments, the logic portion includes first precharge logic, which receives a first precharge input driven by the first power supply. Therefore, the first precharge input has similar timing characteristics across different timing corners as the word line input used in the bit cell. The timing of the access of the data in the bit cell is sufficiently similar to the timing of enabling and disabling the precharging of the bit lines. Thus, there is an insignificant amount of current draw from fighting between the bit cells and the logic portion as both are not driving voltage values on the bit lines at the same time.

The logic portion also includes second precharge logic, which receives a second precharge input driven by the second power supply not used by the bit cell. Therefore, the second precharge input has different timing characteristics across different timing corners from each of the word line input used in the bit cell and the first precharge input used in the logic portion. The second precharge input is used by the logic portion to provide precharged values on the bit lines driven by the second power supply. As the second power supply is different from the first power supply, the logic portion is able to reduce power consumption, balance the timing of read and write access operations, and adjust noise margins.

Turning now to FIG. 1, a generalized diagram of one embodiment of a macro cell 100 used for storing data and providing access to the data is shown. In the embodiment shown, data storage uses a variation of the six-transistor (6T) random access memory (RAM) cell. The cell utilizes pmos transistors 102-104 and nmos transistors 106-108 as a latching element. When the nmos transistors 110 and 112 are enabled by the word line input 114, the latching element has access to the bit lines 116 and 118. When the transistors 102-108 of the latching element resolve the voltage level (data value) on the output nodes, which are drain terminals, the transistors 102-108 do not consume power besides leakage current power.

The data stored by the transistors 102-108 of the latching element is gated from the bit lines 116 and 118 by the nmos transistors 110 and 112. The nmos transistors 110 and 112 continue to block the stored data from the bit lines 116 and 118 until the word line input 114 is enabled by external access logic. The transistors 120-124 provide bit line precharging for the bit lines 116 and 118. The transistors 130-134 ensure the bit lines 116 and 118 provide metastable precharge voltage values until the transistors 110 and 112 are enabled. In some embodiments, only one of the transistors 130 and 134 is used in combination with transistor 132. In other embodiments, both transistors 130 and 134 are used in combination with transistor 132. Whether one or both of the transistors 130 and 134 is used with transistor 132, the gate input of the transistor 132 is driven to a voltage level different than a voltage level used by the gate inputs of one or both of the transistors 130 and 134.

In various embodiments, the macro cell 100 is copied many times and arranged in an array of rows and columns for a memory. In various embodiments, the memory includes external logic (not shown) such as row decoders, column decoders and a sense amplifier. Although the macro cell 100 is shown as a single ported memory macro cell, in other embodiments, the macro cell 100 uses a multi-port design to provide parallel access operations for improved performance. The word line 114 is used to enable the nmos transistors 110 and 112. The word line 114 is also connected to other 6T RAM cells of other macro cells in a corresponding row of the array. A row decoder (not shown) receives address information and enables a single row word line of many row word lines. When the address information indicates the word line 114 is to be enabled, the nmos transistors 110 and 112 of each 6T RAM cell in the row are enabled and provide access for the transistors 102-108 of the latching element to the bit lines 116 and 118.

The transistors 102-108 of the latching element amplify any voltage difference detected between the differential voltages on the bit lines 116 and 118 and resolve these voltages to full swing voltage values. The bit lines 116 and 118 are routed throughout a respective column of the array. The bit lines 116 and 118 are also inputs to a sense amplifier (not shown) and read latches (not shown).

For read access operations, the external sense amplifier is enabled, the external read latches are enabled, and the precharge transistors 120-124 and 130-134 of the macro cell 100 are disabled. Therefore, the transistors 102-108 of the latching element are permitted to resolve the differential voltages on the bit lines 116 and 118 to full voltage swing values. However, as described shortly, the transistors 120, 130 and 134 are used to ensure the precharging circuitry is disabled when the transistors 110 and 112 are enabled to allow the transistors 102-108 of the latching element to resolve the bit lines 116 and 118. Without ensuring the precharging circuirty is disabled, for a given time period each of the precharing circuitry and the latching element concurrently drive voltage values on the bit lines 116 and 118. This concurrent driving of voltage values increases power consumption and reduces the stability of stored values in the latching element.

For write access operations, a column decoder and write logic (not shown) select columns of the array and drive voltage values onto the bit lines 116 and 118 routed throughout a selected column in addition to disabling the precharge signals 140 and 142. Similar to the read access operation, for the write access operation, the transistors 120, 130 and 134 are used to ensure the precharging circuitry is disabled when the transistors 110 and 112 are enabled. The transistors 120, 130 and 134 are used to ensure there is no concurrent driving of voltage values on the bit lines 116 and 118 as concurrent driving increases power consumption and reduces the stability of stored values in the latching element.

The transistors 102-108 of the latching element use a first power supply designated as "VDDM." In addition, the word line input 114 is driven by the first power supply VDDM. In contrast, the precharging transistors 120-124 and the equalization transistor 132 use a second power supply designated as "VDD." The second power supply VDD uses a different voltage level than the first power supply VDDM. Designers use the different power supplies VDDM and VDD in the macro cell 100 to reduce power consumption, balance the timing of the read and write operations and improve noise margins. As transistor sizes decrease, the threshold voltages of the transistors vary more due to the semiconductor processing. As can be seen in the macro cell 100, transistors are often used in pairs, and it is desirable to have the threshold voltage of each transistor in the pair to be very close to the same value. A wide variation causes slower performance if not incorrect results. In addition, leakage current becomes more of a problem. Therefore, designers use different voltage supplies to balance tradeoffs between performance, power consumption and stability of the macro cell 100.

In various embodiments, the power supply VDD is the main power supply for a semiconductor chip which includes a memory utilizing the macro cell 100. The alternate power supply VDDM is not as robust as the main power supply VDD with respect to providing current capacity. Therefore, designers aim to reduce an amount of devices using the alternate power supply VDDM. Accordingly, designers use the alternate power supply VDDM for driving the transistors 102-108 of the latching element and driving the row decoder output which provides the word line input 114 for the macro cell 100. This design choice reduces the amount of logic, and hence the amount of current, needed to be supplied by the voltage supply VDDM. The designers use the main power supply VDD for the transistors performing the precharging of the differential bit lines 116 and 118.

Similar to the precharing transistors 120-124, the precharge input 142 is driven by the power supply VDD. In contrast, the precharge input 140 is driven by the power supply VDDM. The designers can choose to make the power supply VDD at a greater or less voltage level than the power supply VDDM. Therefore, the word line input 114, which is driven by the power supply VDDM, and the precharge input 142, which is driven by the power supply VDD, do not have similar timing characteristics across many timing corners. The signals 114 and 142 become asserted and later deasserted in an unaligned manner with one another.

The misalignment between the signals 114 and 142 allows the gating transistors 110 and 112 to be enabled while the precharging transistors 120-124 are also enabled. Now, the transistors 102-108 of the latching element simultaneously drives values onto the differential bit lines 116 and 118 along with the precharging transistors 120-124. The concurrent access and driving increases power consumption, reduces balance between read and write operations, and decreases stability of data storage in the latching element.

To combat the above design issues, a second precharge input is used, such as precharge input 140, which is driven by the power supply VDDM. Accordingly, the precharge input 140 more easily aligns with the timing across many timing corners of the word line input 114 unlike the precharge input 142. In addition, the transistors 120, 130 and 134 are added to the precharging and equalization circuitry to gate access to the differential bit lines 116 and 118. Again, in some embodiments, only one of the transistors 130 and 134 is used in combination with transistor 132. In other embodiments, both transistors 130 and 134 are used in combination with transistor 132.

The precharge input 140 is logically equivalent with the precharge input 142. However, the precharge input 140 is driven by the power supply VDDM similar to the transistors 102-112 in the above latching element. The precharge input 142 is driven by the power supply VDD similar to the transistors 122, 124 and 132 in the precharging portion. Since the word line input 114 and the precharge input 140 are using the same voltage domain through the power supply VDDM, these two signals align with one another relatively well across timing corners. The precharge input 140 enables and disables the precharge transistors 120, 130 and 134. Therefore, the timing provided by the word line input 114 and the precharge input 140 aligns the accessing of the differential bit lines 116 and 118 between the latching element and the precharging portion. The concurrent driving of voltage values on the differential bit lines 116 and 118 is greatly reduced, if not removed. Therefore, the penalties from concurrently driving voltage values including increased power consumption, reduced balance between read and write operations, and decreased stability of data storage in the latching element are also greatly reduced, if not removed.

During a precharge stage, both the precharge input 140 and the precharge input 142 are driven with logic low values. In addition, the word line input 114 is driven with a logic low value. Therefore, the nmos transistors 110 and 112 are disabled and remove access of the bit lines 116 and 118 from the transistors 102-108 of the latching element. Additionally, the pmos transistors 120-124 and 130-134 are enabled and the differential bit lines 116 and 118 are precharged to values driven by the main power supply VDD. Driving the precharge input 140 on the alternate power supply VDDM does not negatively affect the precharge margin or the ability to precharge the differential bit lines 116 and 118 to the voltage level of the main power supply VDD. Further, as described earlier, the precharge input 140 tracks the word line input 114, which ensures no concurrent driving of values on the bit lines 116 and 118 between the precharing portion and the latching element. As described earlier, in some embodiments, both transistors 130 and 134 are used. In other embodiments, only one of the transistors 130 and 134 is used.

During a data access, such as a read or a write operation, both the precharge input 140 and the precharge input 142 are driven with logic high values. In addition, the word line input 114 is driven with a logic high value. Therefore, the pmos transistors 120, 130 and 134 are disabled in an aligned manner with the enabling of the nmos transistors 110 and 112. The enabled nmos transistors 110 and 112 provide access to the bit lines 116 and 118 for the transistors 102-108 of the latching element. The disabled pmos transistors 120, 130 and 134 disable access to the bit lines 116 and 118 for the transistors 122, 134 and 132 of the precharging portion. The precharge input 142 also disables the pmos transistors 122, 134 and 132, but in a timing manner unaligned with the word line input 114. Therefore, in some cases, the unaligned precharge input 142 continues to enable the pmos transistors 122, 134 and 132 while the latching element is accessing the bit lines 116 and 118. However, the aligned precharge input 140 has already disabled the pmos transistors 120, 130 and 134, which prevents access to the bit lines 116 and 118 for the precharging portion.

As described above, the use of the different power supplies VDD and VDDM within the precharing portion of the macro cell 100 aligns the enabling and disabling of access to the bit lines 116 and 118 between the latching element and the precharging portion. The use of the alternate power supply VDDM to drive the precharge input 140 disables access to the power supply VDD due to the pmos transistor 120. In addition, the use of the alternate power supply VDDM to drive the precharge input 140 removes the equalization path from the bit lines 116 and 118 by disabling the pmos transistors 130 and 134.

Figure 2:
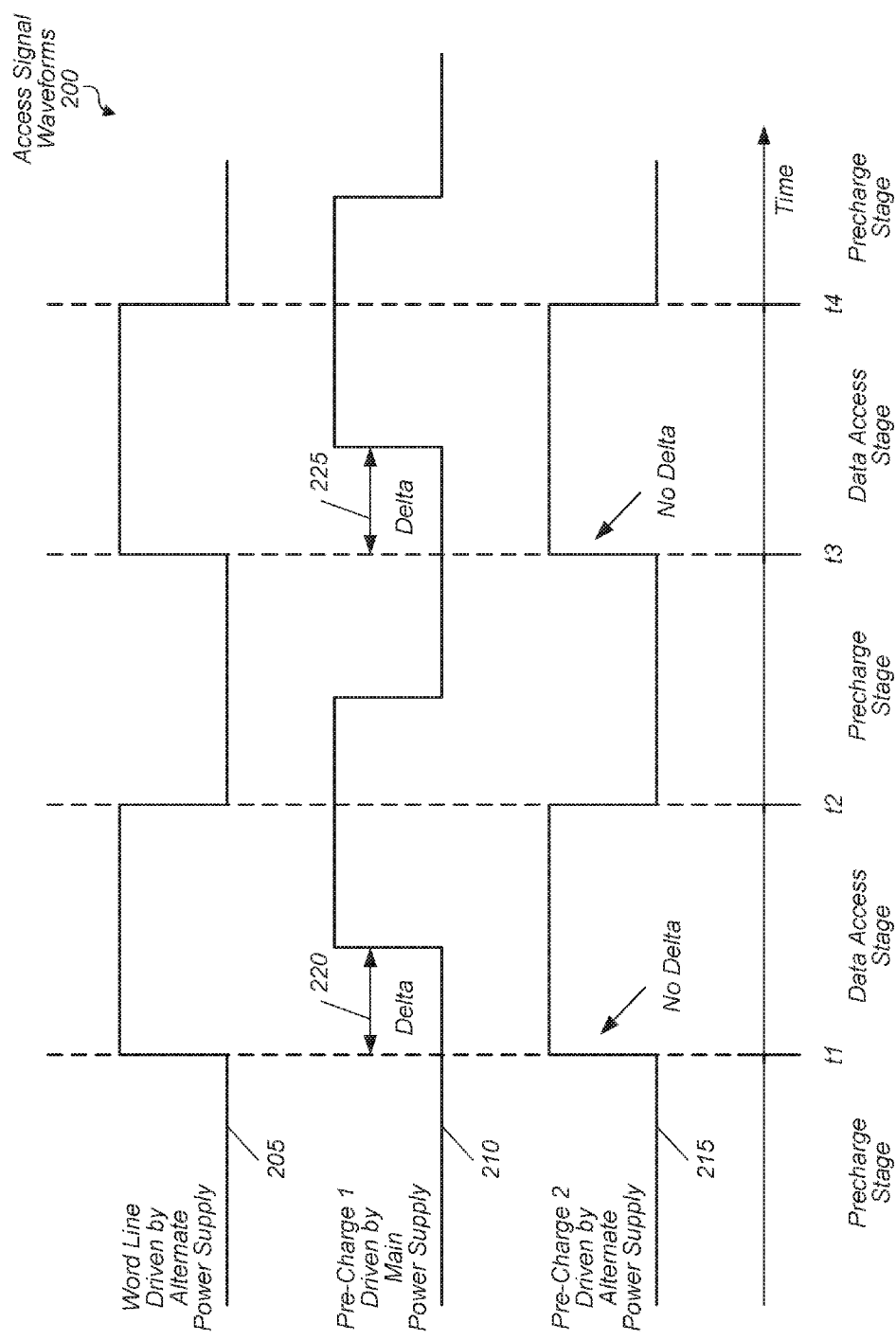
FIG. 2 is a generalized diagram of one embodiment of signal waveforms for controlling access to a memory cell.

Referring now to FIG. 2, a generalized block diagram of one embodiment of memory access signal waveforms 200 over time is shown. In various embodiments, the precharge input 210 is driven by a main power supply, whereas both the word line input 205 and the precharge input 215 are driven by an alternate power supply. The main power supply and the alternate power supply provide different voltage levels for logic and circuitry. In various embodiments, the word line input 205 is used by devices in a latching element of a memory macro cell for gating access to differential bit lines, the precharge input 215 is used by devices in a first precharging portion of the memory macro cell for gating access to differential bit lines, and the precharge input 210 is used by devices in a second precharging portion of the memory macro cell for generating the precharge values driven by the main power supply. In various embodiments, the signal waveforms 200 are used for the memory macro cell 100 described earlier in FIG. 1.

As shown, a precharge access stage alternates with a data access stage. Prior to the time t1, a precharge stage occurs. The word line 205 is driven to a logic low value, which prevents access of the latching element to the differential bit lines by disabling gating nmos transistors. The precharge input 215 is also driven to a logic low value, which provides access to the differential bit lines for precharge values by enabling gating pmos transistors. The precharge input 210 is also driven to a logic low value, which generates the precharge values to be provided on the differential bit lines by enabling precharge generation pmos transistors.

Between time t1 and time t2, a data access stage occurs. The word line 205 is driven to a logic high value, which provides access of the latching element to the differential bit lines by enabling gating nmos transistors. The precharge input 215 is also driven to a logic high value, which prevents access to the differential bit lines for precharge values by disabling gating pmos transistors. Since the word line input 205 and the precharge input 215 are driven by the same alternate power supply, the timing characteristics of these two inputs track one another across multiple timing corners. The rising edges the waveforms 205 and 215 have "no delta" between them. The precharge input 210 is driven to a logic high value, which prevents generating the precharge values.

The precharge input 210 is driven by the different main power supply, and thus, has different timing characteristics from the word line input 205. In contrast to the waveform 215, the precharge input 210 has a delta 220 between its rising edge and the rising edge of the word line input 205. In the illustrated embodiment, the precharge stage and the data access stage alternate. The delta 225 occurs in a similar manner as the delta 220. Without the aid of the precharge input 215, the time periods indicated by the delta 220 and the delta 225 would cause concurrent driving of values on the differential bit lines yielding increase power consumption, reduced balance between read and write operations, and reduced stability for the latching element. Since the precharge input 215 gates access between the differential bit lines and the generated precharge values, the concurrent driving of values with the latching element is avoided.

Figure 3:
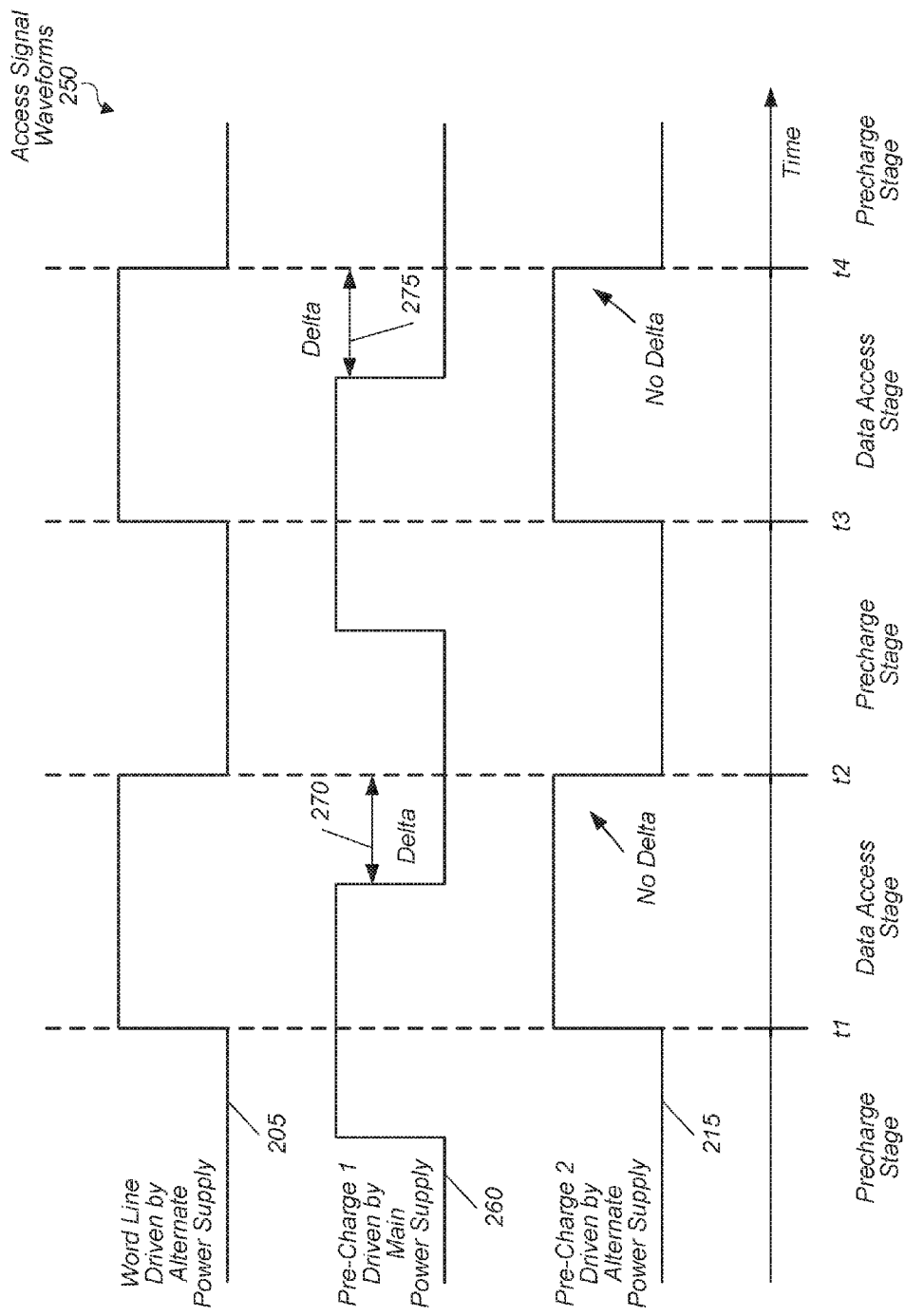
FIG. 3 is a generalized diagram of another embodiment of signal waveforms for controlling access to a memory cell.

Referring now to FIG. 3, a generalized block diagram of another embodiment of memory access signal waveforms 250 over time is shown. The signal waveforms 205 and 215 are the same signals described earlier and accordingly are numbered identically. Here, the precharge input 260 is used by devices in the second precharging portion of the memory macro cell for generating the precharge values driven by the main power supply. However, the precharge input 260 is fast to enable precharge generating pmos transistors.

Again, a precharge access stage alternates with a data access stage. Prior to the time t1, a precharge stage occurs. The word line 205 is driven to a logic low value, which prevents access of the latching element to the differential bit lines by disabling gating nmos transistors. The precharge input 215 is also driven to a logic low value, which provides access to the differential bit lines for precharge values by enabling gating pmos transistors. The precharge input 210 is also driven to a logic low value, which generates the precharge values to be provided on the differential bit lines by enabling precharge generation pmos transistors. However, the precharge input 210, which is unaligned with the signals 205 and 215, is also driven to a logic high value early.

Between time t1 and time t2, a data access stage occurs as described earlier for the waveforms 200. The rising edges the waveforms 205 and 215 have "no delta" between them. However, the unaligned precharge input 260 is driven to a logic low value relatively early, which enables generating the precharge values. The precharge input 260 has a delta 270 between its falling edge and the falling edge of the word line input 205. As the precharge stage and the data access stage alternate, the delta 275 occurs in a similar manner as the delta 270.

Without the aid of the precharge input 215, the time periods indicated by the delta 270 and the delta 275 would cause concurrent driving of values on the differential bit lines yielding increase power consumption, reduced balance between read and write operations, and reduced stability for the latching element. Since the precharge input 215 gates access between the differential bit lines and the generated precharge values, the concurrent driving of values with the latching element is avoided.

Figure 4:
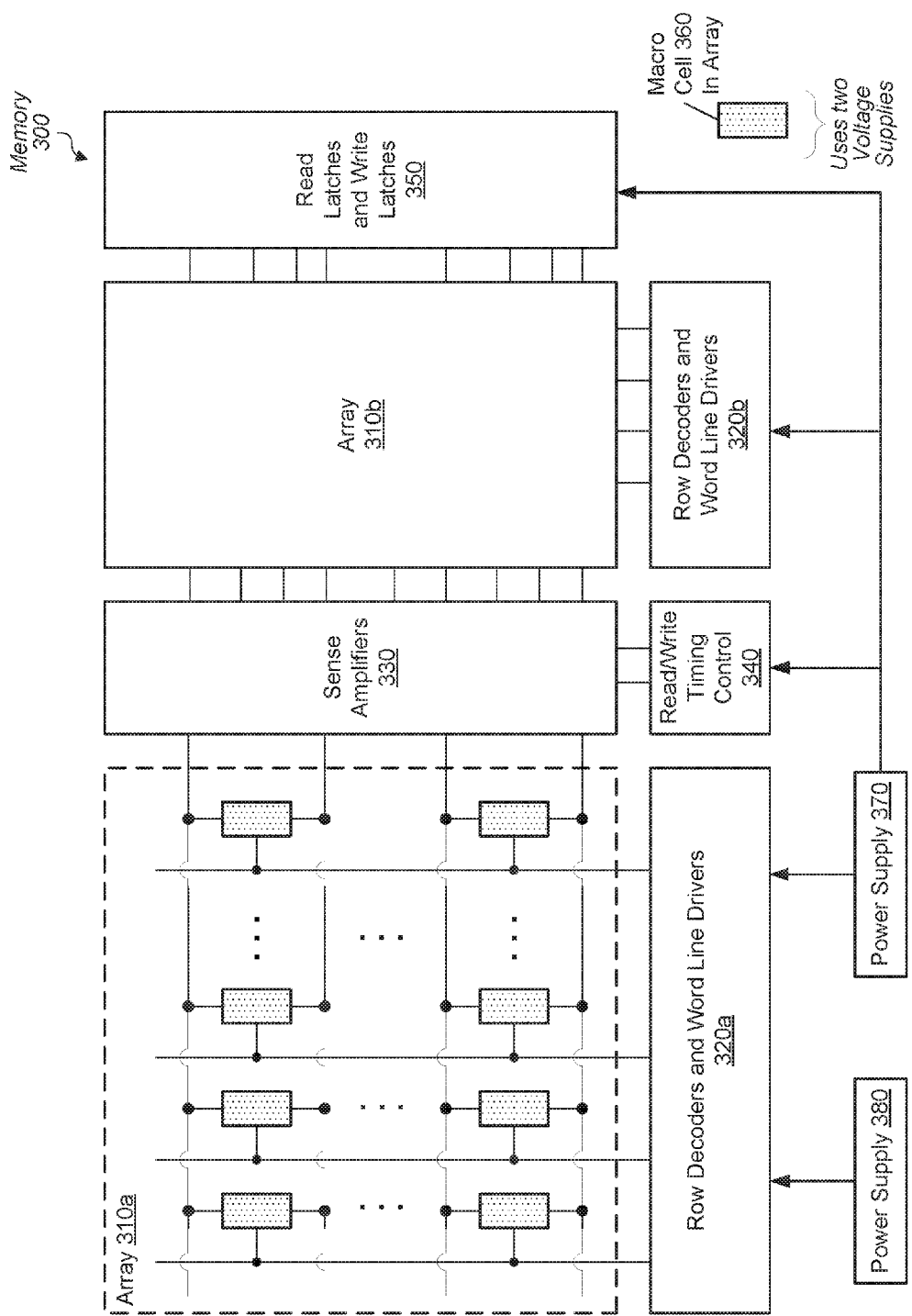
FIG. 4 is a generalized diagram of one embodiment of a memory.

Turning now to FIG. 4, a generalized block diagram of one embodiment of a memory 300 is shown. As shown, the memory 300 includes arrays 310a-310b, row decoders 320a-320b, sense amplifiers in block 330 between the arrays 310a-310b, read and write timing control logic 340 and read latches and write latches in block 350. Each of the blocks 310a-310b, 320a-320b, and 330-350 in the memory 300 is communicatively coupled to another one of the blocks. For example, direct connections are used wherein routing occurs through another block. Alternatively, staging of signals is done in an intermediate block. In various embodiments, each of the arrays 310a-310b includes multiple memory macro cells 360 arranged in a tiled format. Each one of the memory macro cells 360 includes a latching element and a precharge portion. In various embodiments, each one of the latching elements is a copied variation of a six-transistor random access memory (RAM) cell selected based on design needs.

The row decoders and word line drivers in blocks 320a-320b receive address information corresponding to an access request. Each one of the blocks 320a-320b selects a particular row, or entry, of the multiple rows in an associated one of the arrays 320a-320b. For write access requests, the write latches are located in block 350. The write data is driven into the arrays 310a-310b. The timing control logic 340 sets up the write word line driver logic and updates the write latches with new data in block 350. The write data is written into a row of bit cells that is selected by an associated one of the blocks 320a-320b.

For read access requests, control logic deasserts the precharge inputs to the memory macro cells in the arrays 310a-310b corresponding to the selected row and columns. In various embodiments, the control logic is in blocks 320a-320b similar to the logic used for asserting and deasserting word line inputs. In other embodiments, the control logic is in block 340. The timing logic in block 340 is used for setting up the sense amplifiers in the block 330. A row selected by an associated one of the row decoders 320a-320b provides its data on the read lines, which are sensed by the sense amplifiers. The read latches capture the read data. For each of the write access requests and read access requests, the selected row has certain memory macro cells selected for completion of the access request. It is noted that while signals are variously described as having a state such as asserted or deasserted herein to provide particular logical behaviors, those skilled in the art will appreciate that in other embodiments the logic may be changed such that similar logical behaviors may be achieved by signals that have the opposite states (e.g., asserted rather than deasserted, and vice-versa). All such embodiments are contemplated.

As shown, each of the blocks 320a-320b, 340 and 350 receive source voltage from the power supply 370. In various embodiments, the power supply 370 is a main power supply for the memory 300. Each of the arrays 310a-310b also receive source voltage from the power supply 370 via routing through other blocks or from separate power supplies supplying a same voltage level as the power supply 370. In various embodiments, the precharging portion of the memory macro cells 360 in the arrays 310a-310b use the power supply 370.

In various embodiments, each of the arrays 310a-310b and the blocks 320a-320b he arrays also receive a source voltage level from the voltage supply 380, which provides a different voltage level than the power supply 370. In various embodiments, the power supply 380 is an alternate power supply for the memory 300. The different power supply 380 is used to reduce power consumption, balance read and write operations and improve noise margins. In addition, as described earlier, each of the memory macro cells 360 use two power supplies such as the power supplies 370 and 380. By using the two power supplies 370 and 380, the memory macro cells 360 in the arrays 310a-310b align the word line inputs with a subset of the precharge inputs across various timing corners.

Figure 5:
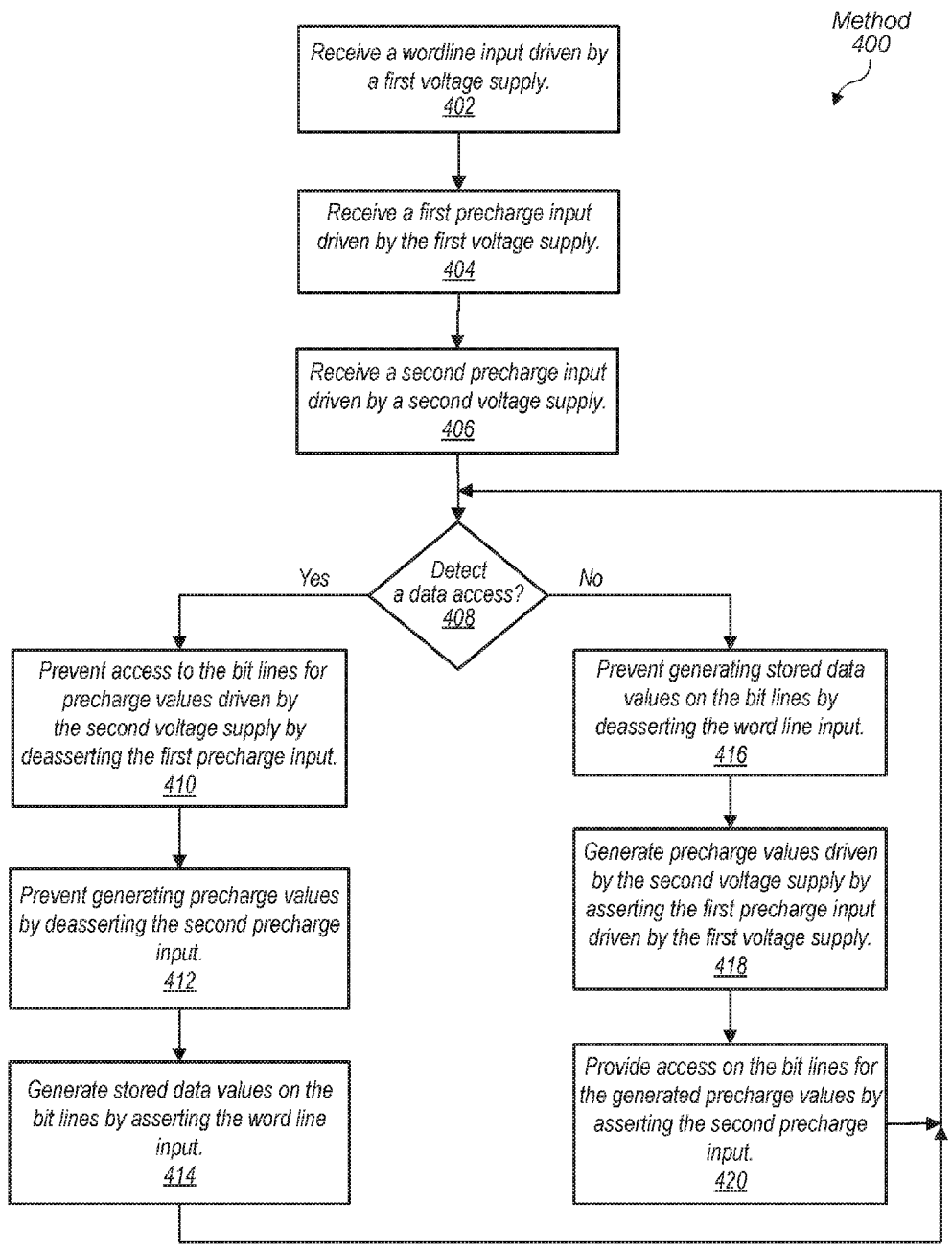
FIG. 5 is a generalized diagram of one embodiment of a method for controlling access to a memory.

Referring now to FIG. 5, one embodiment of a method 400 for controlling access to a memory is shown. For purposes of discussion, the steps in this embodiment are shown in sequential order. However, in other embodiments some steps occur in a different order than shown, some steps are performed concurrently, some steps are combined with other steps, and some steps are absent.

A word line input driven by a first voltage supply is received by a latching element (block 402). In various embodiments, the first power supply is an alternate power supply. A first precharge input driven by the first voltage supply is received by a first precharging portion (block 404). A second precharge input driven by a second voltage supply different from the first power supply is received by a second precharging portion (block 406). In various embodiments, the second power supply is the main power supply on a semiconductor chip intended to drive a large current capacity on the chip.

In various embodiments, when an access occurs for data stored in the latching element of a memory macro cell, control logic in row decoders select a particular row in a memory array. For example, the memory array includes memory macro cells arranged in rows and columns. Each row corresponds to data to access. The width of the data sets the number of columns to access. The row decoder selects the particular row by enabling the word line for the particular row. Control logic in column decoders selects the columns in the memory array to access by disabling precharge inputs for the selected columns.

If data access is detected for data stored in the latching element of the memory macro cell ("yes" branch of the conditional block 408), then access to the bit lines of the macro cell for precharge values driven by the second voltage supply is prevented by deasserting the first precharge input (block 410). The precharge values are prevented from being generated by deasserting the second precharge input (block 412). The stored data values are generated on the bit lines by asserting the word line input (block 414). Since the word line input and the first precharge input are both driven by the same power supply, which is the first power supply, these two inputs track one another relatively well and include similar timing characteristics across timing corners. Therefore, an insignificant amount, if any, of concurrent driving of values on the bit lines occurs between the precharging portion and the latching element.

If data access is not detected for data stored in the latching element of the memory macro cell ("no" branch of the conditional block 408), then the stored data values are prevented from being generated on the bit lines by deasserting the word line input (block 416). Precharge values driven by the second voltage supply are generated on the bit lines by asserting the first precharge input driven by the first voltage supply (block 418). The generated precharge values have access provided on the bit lines by asserting the second precharge input (block 420). Again, as the word line input and the first precharge input are both driven by the same power supply, which is the first power supply, these two inputs track one another and an insignificant amount, if any, of concurrent driving of values on the bit lines occurs between the precharging portion and the latching element.

Figure 6:
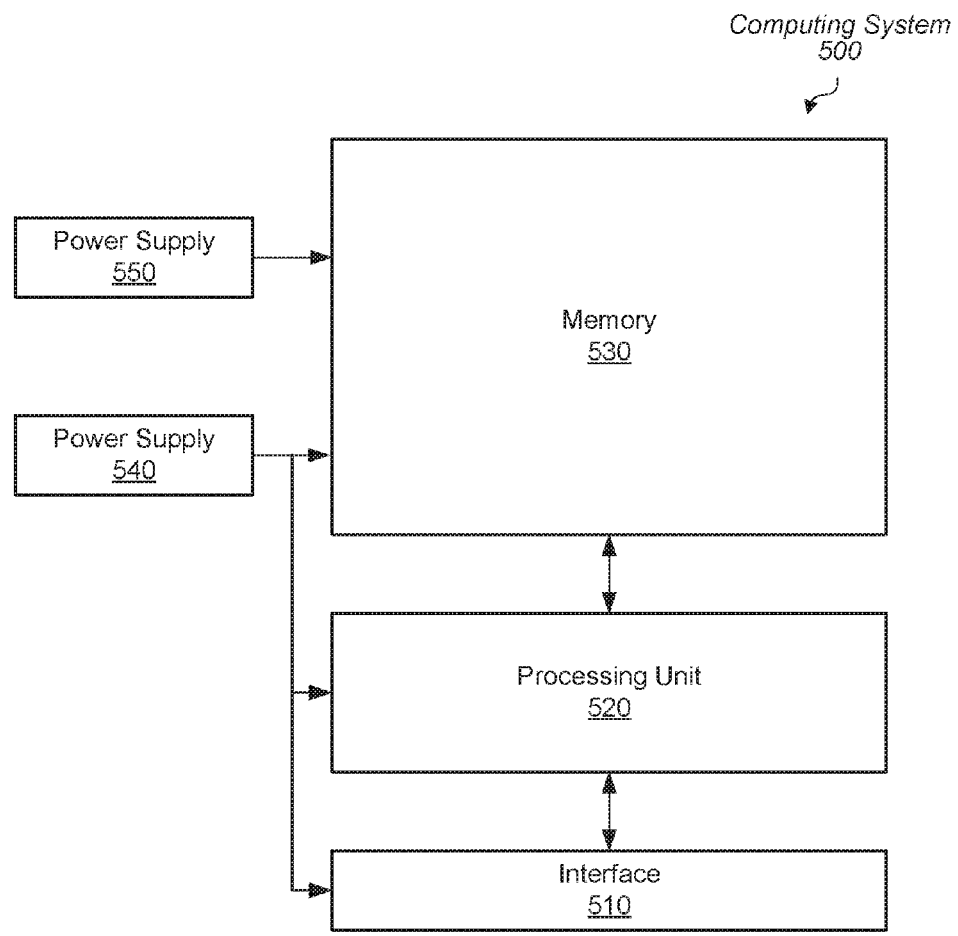
FIG. 6 is a generalized diagram of one embodiment of a computing system.

Referring to FIG. 6, one embodiment of a computing system 500 is shown. The computing system 500 includes a processing unit 520, a memory 530, and an interface 510. The memory 530 includes an array of memory macro cells and access control logic. In various embodiments, each of the interface 510, the processing unit 520 and the memory 530 receive a voltage level for logic and circuitry from the power supply 540. In various embodiments, the power supply 540 is a main power supply for the computing system 500. The memory 530 additionally receives a voltage level for logic and circuitry from the power supply 550. In various embodiments, the power supply 550 is an alternate power supply for the computing system 500 and it is unable to supply a same current draw as the main power supply 540.

In various embodiments, the memory 530 includes an array of memory macro cells arranged in rows and columns. Each of the memory macro cells includes a latching element and a precharging portion for driving values on differential bit lines. In various embodiments, the precharging portion uses both the power supply 540 and the power supply 550, whereas the latching element uses the power supply 550. Although in some embodiments, each of the processing unit 520 and the interface 510 also include logic and circuitry driven by one or more power supplies, these connections are not shown for ease of illustration.

In some embodiments, the functionality of the computing system 500 is included as components on a single die, such as a single integrated circuit. In other embodiments, the functionality of the computing system 500 is included as multiple dies on a system-on-a-chip (SOC). In various embodiments, the computing system is used in a desktop, a portable computer, a mobile device, a server, a peripheral device, or other.

The interface 510 includes interface control logic for communicating with devices and units located externally to the computing system 500. The control logic in the interface 510 operates according to communication protocols corresponding to external units. The interface 510 includes buffers for storing both internally and externally generated requests and results.

The processing unit 520 processes instructions of a predetermined algorithm. The processing includes fetching instructions and data, decoding instructions, executing instructions and storing results. In some embodiments, the processing unit 520 is a general-purpose microprocessor. In other embodiments, the processing unit 520 is an application specific integrated circuit (ASIC). In yet other embodiments, the processing unit is a single-instruction-multiple-data (SIMD) microarchitecture processor. In still further embodiments, the processing unit 520 includes the functionality of two or more different architectures such as a general-purpose central processing unit (CPU) and a SIMD processor such as a graphics processing unit (GPU). While processing instructions, the processing unit 520 performs calculations and generates memory access requests for retrieving instructions and operand data and for storing result data.

The memory 530 is accessed for the fetching operations and the generated memory access requests, which include storing results. In some embodiments, the memory 530 is a cache hierarchy memory subsystem. In other embodiments, the memory 530 is a random access memory (RAM). Although a single memory is shown, in various embodiments, multiple memories are used in the computing system 500. In some embodiments, the memory 530 is a complete memory. In other embodiments, the memory 530 is a portion of a memory subsystem.

The precharging portion of macro cells in the memory 530 additionally receives source voltage from the voltage supply 550, which provides a different voltage level than the power supply 540. Using the two different power supplies 540 and 550 in the memory 530 is done to reduce power consumption, balance read and write operations and improve noise margins. In some embodiments, the memory 530 is a static random access memory (SRAM) and the computing system 500 is used for low-power applications. One or more of the power supplies 540 and 550 provides a relatively low voltage level. The on-die real estate of the memory 530 is restrained in order for the computing system 500 to be used in embedded systems, mobile devices including medical monitors, wearable electronics, and so forth. The memory 530 is still directed at storing a relatively large amount of data, such as patient data, while providing a long operating battery lifetime.

In order to achieve the above design goals, the memory 530 utilizes the multiple power supplies 540 and 550 in addition to using memory macro cells where each of the latching element and the precharging portion of the memory macro cell receives source voltage from the power supply 540. Therefore, the corresponding word line inputs and precharge inputs have similar timing characteristics across various timing corners without expensive additional devices for aligning and shaping these inputs. Asserting and deasserting these inputs is done in an aligned manner such as through the use of the memory macro cell 100 described earlier in FIG. 1.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A memory comprising:
an array comprising a plurality of cells for storing data;
a logic portion coupled to the array;
wherein the array is configured to receive a word line input driven by a first voltage supply; and
wherein the logic portion is configured to:
receive a first precharge input driven by the first voltage supply;
receive a second precharge input driven by a second voltage supply different from the first voltage supply; and
generate precharge values driven by the second voltage supply on a plurality of bit lines coupled to each of the array and the logic portion.

2. The memory as recited in claim 1, wherein:
the logic portion comprises first precharge circuitry and second precharge circuitry different from the first precharge circuitry; and
performing an access operation for given data stored in the array comprises:
preventing access by the first precharge circuitry to given bit lines coupled to a given cell at a first point-in-time, based at least in part on a state of the first precharge input; and
preventing access by the second precharge circuitry to the given bit lines at a second point-in-time different than the first point-in-time, based at least in part on a state of the second precharge input.

3. The memory as recited in claim 2, wherein performing the access operation further comprises removing an equalization path between the given bit lines at the first point-in-time, based at least in part on a state of the first precharge input.

4. The memory as recited in claim 2, wherein performing the access operation further comprises providing access for the given cell to the given bit lines at the first point-in-time, based at least in part on a state of the word line input.

5. The memory as recited in claim 4, wherein the given cell is configured to generate data values driven by the first voltage supply on the given bit lines.

6. The memory as recited in claim 2, wherein completing the access operation for the given data stored in the array comprises:
providing access by the first precharge circuitry to the given bit lines at a third point-in-time, based at least in part on a state of the first precharge input; and
providing access by the second precharge circuitry to the given bit lines at a fourth point-in-time different from the third point-in-time, based at least in part on a state of the second precharge input.

7. The memory as recited in claim 6, wherein completing the access operation further comprises preventing access to the given bit lines for the given cell at the third point-in-time, based at least in part on a state of the word line input.

8. The memory as recited in claim 2, wherein the first circuitry comprises a first pmos transistor between the second voltage supply and drain inputs of bit line precharge pmos transistors of the second circuitry, wherein the first pmos transistor receives the first precharge input on its gate terminal.

9. The memory as recited in claim 2, wherein the first circuitry comprises a first equalization pmos transistor and a second pmos equalization transistor on either side of a third equalization transistor of the second circuitry, wherein each of the first equalization pmos transistor and the second pmos equalization transistor receives the second precharge input on a respective gate terminal.

10. A method comprising:
storing data in a plurality of cells of an array;
receiving by the array a word line input driven by a first voltage supply;
receiving by a sense amplifier a first precharge input driven by the first voltage supply;
receiving by the sense amplifier a second precharge input driven by a second voltage supply different from the first voltage supply; and
providing by the sense amplifier precharge outputs driven by the second voltage supply on a plurality of bit lines coupled to each of the array and the sense amplifier.

11. The method as recited in claim 10, wherein performing an access operation for given data stored in the array comprises:

preventing access by first precharge circuitry to given bit lines coupled to a given cell at a first point-in-time, based at least in part on a state of the first precharge input; and preventing access by second precharge circuitry, different than the first precharge circuitry, to the given bit lines at a second point-in-time different than the first point-in-time, based at least in part on a state of the second precharge input.

12. The method as recited in claim 11, wherein performing the access operation further comprises removing an equalization path between the given bit lines at the first point-in-time, based at least in part on a state of the first precharge input.

13. The method as recited in claim 11, wherein performing the access operation further comprises providing access for the given cell to the given bit lines at the first point-in-time, based at least in part on a state of the word line input.

14. The method as recited in claim 13, wherein the given cell is configured to generate data values driven by the first voltage supply on the given bit lines.

15. The method as recited in claim 11, wherein completing the access operation for the given data stored in the array comprises:

providing access via for the first precharge circuitry to the given bit lines at a third point-in-time, based at least in part on a state of the first precharge input; and providing access for the second precharge circuitry to the given bit lines at a fourth point-in-time different from the third point-in-time, based at least in part on a state of the second precharge input.

16. The method as recited in claim 14, wherein completing the access operation further comprises preventing access to the given bit lines for the given cell at the third point-in-time, based at least in part on a state of the word line input.

* * * * *